(12) United States Patent
Cheng et al.

(10) Patent No.: US 7,683,670 B2
(45) Date of Patent: Mar. 23, 2010

(54) HIGH-SPEED LOW-POWER INTEGRATED CIRCUIT INTERCONNECTS

(75) Inventors: Zhibin Cheng, Cary, NC (US); Satyajit Dutta, Austin, TX (US); Peter J. Klim, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/421,457

(22) Filed: May 31, 2006

(65) Prior Publication Data

US 2007/0279097 A1 Dec. 6, 2007

(51) Int. Cl.
*H03K 19/0175* (2006.01)
*H03K 19/094* (2006.01)

(52) U.S. Cl. .............. 326/83; 326/82; 326/84; 326/85; 326/86

(58) Field of Classification Search ............ None
See application file for complete search history.

(56) References Cited

U.S. PATENT DOCUMENTS

| | | | |
|---|---|---|---|
| 5,548,229 A | | 8/1996 | Segawa et al. |
| 5,563,539 A | * | 10/1996 | Takase ............. 327/185 |
| 5,614,859 A | * | 3/1997 | Ong ............. 327/333 |
| 6,008,665 A | | 12/1999 | Kalb et al. |
| 6,448,830 B1 | | 9/2002 | Chuang et al. |
| 6,472,915 B1 | | 10/2002 | Moyal et al. |
| 7,288,967 B2 | * | 10/2007 | Byun et al. ............. 326/83 |
| 2004/0257122 A1 | | 12/2004 | Mori |
| 2005/0280443 A1 | * | 12/2005 | Papanikolaou et al. ........ 326/86 |

OTHER PUBLICATIONS

H. S. Deogun et al., "Dynamically Pulsed MTCMOS with Bus Encoding for Total Power and Crosstalk Minimization," Proc. SQED'05, IEEE Computer Society, pp.-6.

* cited by examiner

*Primary Examiner*—Vibol Tan
*Assistant Examiner*—Matthew C. Tabler
(74) *Attorney, Agent, or Firm*—Mark E. McBurney; Schubert Osterrieder & Nickelson PLLC

(57) ABSTRACT

Embodiments that decrease power consumption of interconnecting devices in integrated circuits are disclosed. Embodiments reduce power consumption in integrated circuits by generating full and reduced swing signals at an output of a driver module in response to a control signal during and deactivating one or more elements to conserve power after an input signal remains unchanged for a period of time. Another embodiment reduces power consumption in a circuit, the embodiment comprising a swing module coupled with a swing selector and an output controller. The swing module may generate full or low swing signals depending on the state of the swing selector. The output controller may increase the output impedance of the swing module after an input signal to the swing module remains unchanged for a quantity of time. Various apparatus embodiments include portable computing devices and cellular telephones.

19 Claims, 6 Drawing Sheets

| 455 (N-3) | 460 (N-2) | 465 (N-1) | 470 N | 475 TS = NOR (N-3 XOR N-2 XOR N-1 XOR N) |
|---|---|---|---|---|
| 0 | 0 | 0 | 0 | 1 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 0 |
| 1 | 0 | 0 | 0 | 0 |
| 1 | 0 | 0 | 1 | 0 |
| 1 | 0 | 1 | 0 | 0 |
| 1 | 0 | 1 | 1 | 0 |
| 1 | 1 | 0 | 0 | 0 |
| 1 | 1 | 0 | 1 | 0 |
| 1 | 1 | 1 | 0 | 0 |
| 1 | 1 | 1 | 1 | 1 |

HIGH-SPEED LOW-POWER INTEGRATED CIRCUIT INTERCONNECTS

FIELD

The present invention generally relates to the field of integrated circuits. More particularly, the present invention relates to methods and apparatuses to decrease power consumption of interconnecting devices in integrated circuits.

BACKGROUND

Our society relies on computer systems in innumerable ways. Computer systems, which employ processors and other integrated circuits, control devices in our homes, in our business offices, in our manufacturing facilities, in our automobiles, and even in outer space. One can find integrated circuits in such devices as desktop and laptop computers, mainframe computing systems, and in portable devices, such as mobile telephones and palm-held computers. Many if not most of the applications are demanding improved performance from processors and other integrated circuits. Electronics designers have responded to this demand by employing various techniques and design methods to increase performance of newer integrated circuits.

Designers generally increase performance of integrated circuits by increasing the operating frequencies and by increasing the number of components, such as transistors, in the circuits. To keep the circuit sizes manageable, designers have reduced or scaled down the size of the circuit components so that larger numbers of devices fit within smaller per unit areas. Today it is not uncommon to find advanced computer system chips that contain millions, even billions, of transistors. This increased density, however, has created numerous problems. One problem is heat. Since individual electronic components, such as transistors, each generate minute quantities of heat when operating, increased numbers of such devices in the newer circuits naturally lead to increased quantities of heat. Another problem is power consumption. Again, since each electronic circuit component consumes a minute amount of power while operating, circuits with increased numbers of such circuit components generally consume larger quantities of power.

Other problems seen in newer electronic devices are those associated with scaling. While smaller circuit component dimensions have generally resulted in faster response times for many devices, such as transistor gate delays, the components often have problems related to their reduced sizes. For example, as integrated circuit die areas have decreased, transistors have suffered from problems of quantum-mechanical tunneling of carriers through thin gate oxide, both from drain to source and from drain to body. Even when faced with these problems integrated circuit designers are continually pressured to increase performance of the circuits while reducing power consumption.

As mentioned, designers have increased performance by continually scaling the circuits using smaller and smaller technologies, such as 90 nm and 65 nm technologies. They have also increased performance by increasing the clock speeds. They have reduced latencies by reducing the physical channel length of the circuit elements, reducing the voltage supplies for the elements, and reducing the threshold voltages of transistors. However, reduced threshold voltages and reduced channel lengths of transistors have resulted in higher subthreshold leakage currents. Accordingly, subthreshold leakage power, increased power consumption, and increased heat dissipation have rapidly become formidable challenges for integrated circuit designers. Moreover, with the increased use of portable electronic systems, reducing power consumption has become a paramount design concern. Power dissipation reduces battery life, decreases system performance, reduces system reliability, and increases system packaging costs.

Buffers used to manage signal delay and signal integrity problems for long on-chip buses are sources of significant quantities of leakage power. Buffers or inverters often contribute around half of total device width on chips. Additionally, inserting on-chip buffers along global lines results in higher dynamic power consumption, even when data signals remain unchanged. Reducing supply voltage results in significantly lower power dissipation, but such reduced voltage significantly impacts delay. In constant-throughput applications the performance loss associated with low voltage supply operation may be recovered by increasing pipelining or parallelism, but such techniques increase circuit latencies. What are needed are new leakage power saving schemes for such circuits as inverters, buffers, repeaters, and drivers that eliminate unnecessary dynamic power consumption, yet do not sacrifice circuit throughputs or latencies.

SUMMARY

The problems identified above are in large part addressed by embodiments to decrease power consumption of interconnecting devices in integrated circuits, which include processor integrated circuits. One embodiment reduces power consumption in integrated circuits. The embodiment generally involves generating a high swing signal at an output of a driver module when a control signal is in a first state and generating a low swing signal at the output when the control signal is in a second state. The embodiment also includes deactivating one or more elements in the driver module to conserve power when an input signal remains unchanged for a period of time. Alternative embodiments also comprise receiving the swing signals in a receiving circuit, wherein the receiving circuit is coupled with the driver module via a substantially conductive material. Another alternative embodiment includes increasing the output impedance of the driver module when the input signal remains unchanged for the period of time.

Another embodiment reduces power consumption in an integrated circuit. The embodiment generally comprises a swing circuit coupled with a swing selector and an output controller. The swing circuit may generate a full swing signal or a low swing signal depending on the state of the swing selector. The output controller may increase the output impedance of the swing circuit when an input signal to the swing circuit remains unchanged for a quantity of time. Variations of embodiments include a receiver circuit coupled with the swing circuit to receive the full swing and low swing signals for use in a separate circuit coupled with the receiver circuit. An alternative embodiment comprises field effect transistors to reduce a voltage potential and generate the low swing signal. One embodiment comprises latches to store states of the input signal and logic blocks to compare the input signal with the stored states in determining when the input signal remains unchanged.

A further embodiment comprises a driver circuit that receives an input signal and generates a full swing signal and a reduced swing signal at an output of the driver circuit based upon a swing control signal. The embodiment also has a tri-state control circuit to monitor activity of the input signal and increase the output impedance of the driver circuit when the input signal remains inactive. Various embodiments include portable computing devices, cellular telephones, and computers.

BRIEF DESCRIPTION OF THE DRAWINGS

Aspects of the invention will become apparent upon reading the following detailed description and upon reference to the accompanying drawings in which, like references may indicate similar elements.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and apparatuses to decrease power consumption of interconnecting devices in integrated circuits are disclosed. New leakage power saving schemes for such circuits as inverters, buffers, repeaters, and drivers that eliminate unnecessary dynamic power consumption, yet do not sacrifice circuit throughputs or latencies, are discussed. Embodiments comprise methods to reduce power consumption in integrated circuits. The methods generally involve generating high and low swing signals at an output of a driver module. In these method embodiments, one or more elements in the driver module are deactivated to conserve power when an input signal remains unchanged for a period of time. In some embodiments, the output impedance of the driver module is increased after the period of time has elapsed.

While portions of the following detailed discussion describe many embodiments comprising drivers, inverters, buffers, and receivers in a single integrated circuit, upon review of the teachings herein, a person of ordinary skill in the art will recognize that the following invention may be practiced and applied in a variety of settings, such as when connecting portions of different integrated circuits housed in separate assemblies, or chips. All methods of practicing the invention are interchangeable. Further, some discussions for embodiments describe using field effect transistors, XOR, and OR logic gates. One of ordinary skill in the art will recognize that other types of transistors, circuit elements, and logic blocks may be substituted for the described elements when employed in accordance with similar constraints to perform substantially equivalent functions.

Figure 1:
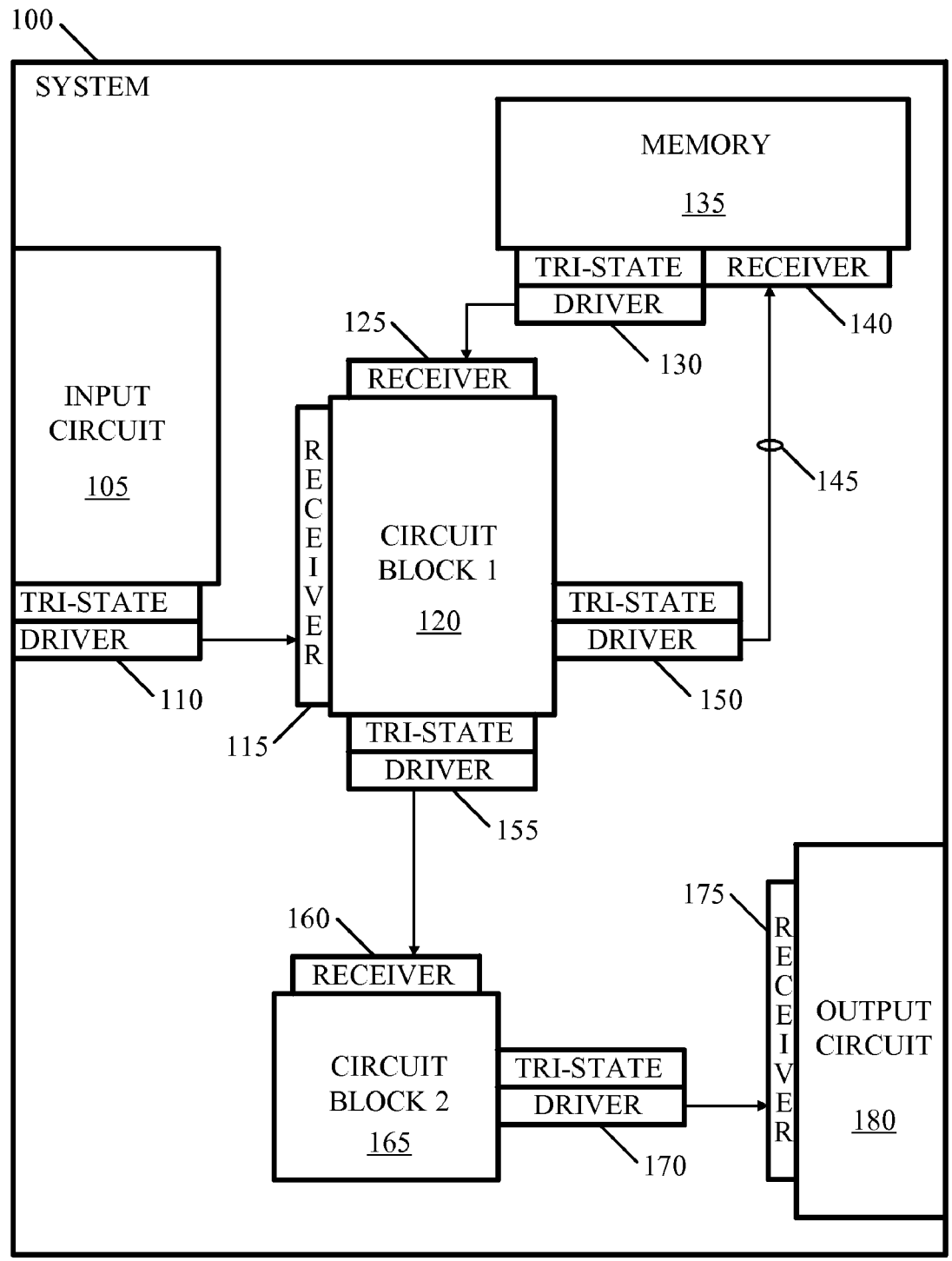
FIG. 1 depicts a system having an input circuit, an output circuit, memory, two circuit blocks, and numerous driver-receiver pairs for transmitting signals between different parts of the system.

Turning to the drawings, FIG. 1 illustrates a system 100 employing numerous driver-receiver pairs for transmitting signals between various integrated circuit elements. One or more of the driver-receiver pairs shown for system 100 may employ methods and apparatuses to decrease power consumption of interconnecting devices. System 100 may comprise an integrated circuit on a chip, such as a part of a processor for a computing device, or an application specific integrated circuit (ASIC) for a device such as a cellular telephone or portable music player. As shown in FIG. 1, system 100 may be divided into numerous functional areas and comprise numerous components, such as input circuit 105, memory 135, a first circuit block 120, a second circuit block 165, and an output circuit 180.

As depicted in FIG. 1, system 100 may have input circuit 105 to receive one or more signals from devices and circuits external to system 100. System 100 may comprise an apparatus capable of interacting with digital and analog signals, employing such components as an analog-to-digital (A/D) converter and a digital-to-analog (D/A) converter. For example, system 100 may be an ASIC for a cellular telephone, with input circuit 105 comprising an A/D converter coupled with a microphone, translating analog signals generated by a voice of a person speaking into the microphone into digital signals that may be processed by circuit block 120 and circuit block 165. Similarly, output circuit 180 may comprise a D/A converter and an amplifier coupled with a speaker of the cellular telephone, translating digital signals processed by circuit blocks 120 and 165 into analog signals used to generate sounds from the speaker.

In alternative embodiments, input circuit 105 and/or output circuit 180 may comprise digital-only circuits receiving and sending digital signals for system 100. For example, system 100 may comprise a memory controller circuit coupled with a processor via input circuit 105 and output circuit 180. In such an embodiment, circuit block 120 may receive digital bits in the form of words, such as eight, sixteen, or thirty-two bit words, from input circuit 105 via tri-state driver 110 and receiver 115. Circuit block 120 may perform one or more operations on the received data and store the processed data in memory 135 via tri-state driver 150, interconnect 145, and receiver 140. In such case, interconnect 145 may comprise a bus with numerous interconnects in parallel, such that tri-state driver 150 and receiver 140 transmit numerous signals from circuit block 120 to memory 135 in parallel. Alternatively, interconnect 145 may be part of a serial bus wherein tri-state driver 150 is used to transmit signals to receiver 140 in a serial fashion. Similar to tri-state driver 150 and receiver 140, tri-state driver 130 and receiver 125 may retrieve stored data from memory 135 for circuit block 120.

In system 100, one circuit block may transmit signals to another circuit block using methods and apparatuses that decrease power consumption of interconnecting devices. As depicted in FIG. 1, circuit block 120 may transmit signals to circuit block 165 via tri-state driver 155 and receiver 160. In turn, circuit block 165 may process the signals received from circuit block 120 and send the processed signals to output circuit 180 via tri-state driver 170 and receiver 175. As mentioned above, output circuit 180 may use the processed signals it receives to drive a speaker or transfer data to a processor. The input, output, memory, and circuit blocks shown in FIG. 1 for system 100 are intended to illustrate some of the various integrated circuit configurations that may employ high-speed low-power interconnects.

One or more of the tri-state drivers shown in FIG. 1 may decrease power consumption by operating in two modes and driving three levels of logic. One mode may be referred to as a high or full swing mode. The tri-state drivers may operate in this full swing mode when timing may be critical and require faster circuit performance. In the full swing mode the tri-state drivers may propagate or transfer logic signals at voltage magnitudes comparable to the nominal voltage supplying the logic circuits. For example, if the nominal supply voltage Vdd is 1 volt with the nominal supply ground potential Vss being equal to 0 volts, the tri-state drivers may propagate logic signals using logical highs and logical lows approximating 1 and 0 volts, respectively. To give an even more detailed example, a gate input signal line may have a logical 1 or "true" state when the potential of the gate signal is 0.907 volts, and have a logical 0 or "false" state when the voltage of the gate potential is 0.104 volts.

When timing is not critical, one or more of the tri-state drivers may operate in a second mode which may be referred to as a low swing or reduced swing mode. When in the reduced swing mode, a driver circuit may operate at a reduced voltage but may consume less power. In the reduced swing mode the tri-state drivers may transfer logic signals at voltage magnitudes lower than the nominal voltage supplying the logic circuits. Continuing our previous example, if the nominal supply voltage Vdd is again 1 volt and the nominal supply ground Vss is 0 volts, the tri-state drivers may transmit logic signals using logical highs and logical lows that have voltage level swings lower than the potential difference of Vdd and Vss. For example, when the tri-state driver operates in the reduced swing mode, a gate input may have a logical 1 or "true" state when the voltage level is 0.79 volts and have a logical 0 or "false" state when the gate potential is 0.202 volts. The tri-state driver circuit may switch from the full swing mode to the reduced swing mode upon a state change of a control signal coupled with the driver. A circuit external to the driver circuit may change the control signal state to reduce power consumption in the driver circuit.

When a tri-state driver does not need to transmit logic signals to another circuit, a tri-state control signal may place the driver in a tri-state mode. In other words, the tri-state control signal may increase the output impedance of the driver circuit. A separate tri-state control circuit may monitor the input to the driver circuit for activity. Whenever the input remains inactive for an extended period of time, the tri-state control circuit may dynamically change the state of the tri-state control signal to increase the output impedance of the driver circuit. For example, the tri-state control circuit may monitor the driver circuit input for activity. Whenever the input remains in the same state for several clock cycles, the tri-state control circuit may trigger the tri-state control signal and place the driver in the tri-state mode, wherein the driver circuit has a high output impedance.

As mentioned above, FIG. 1 illustrates system 100 employing numerous driver-receiver pairs for transmitting signals between various integrated circuit elements. In some embodiments, system 100 may be a central processing unit (CPU). In other embodiments, system 100 may comprise a microcontroller or other type of integrated circuit. Also, in different embodiments, single or multiple parts of the integrated circuit may benefit from using high-speed interconnects that consume low amounts of power. In other words, one embodiment may employ a single high-speed low-power interconnect, while other embodiments may employ two, ten, a hundred, or thousands of such interconnects. Additionally, the interconnects of some embodiments may comprise a single conductive element between the driver circuits and the receiver circuits, while the interconnects of other embodiments may comprise multiple conductive elements between the driver and receiver circuits. Even further, the voltages of the full and reduced swing signals may vary from embodiment to embodiment. For example, the logical high voltage level for a full swing signal may measure 0.8 volts in one embodiment and 5 volts in another. Similarly, the reduced swing voltage signal may swing from 0.9 volts to 0.6 volts in some embodiments, while it swings from 0.4 volts to −0.03 volts in other embodiments. Simply stated, both the nominal voltage levels and the magnitudes of the voltage swings for the interconnecting circuits may vary from embodiment to embodiment and even from interconnecting circuit to interconnecting circuit in a single system embodiment.

Figure 2:
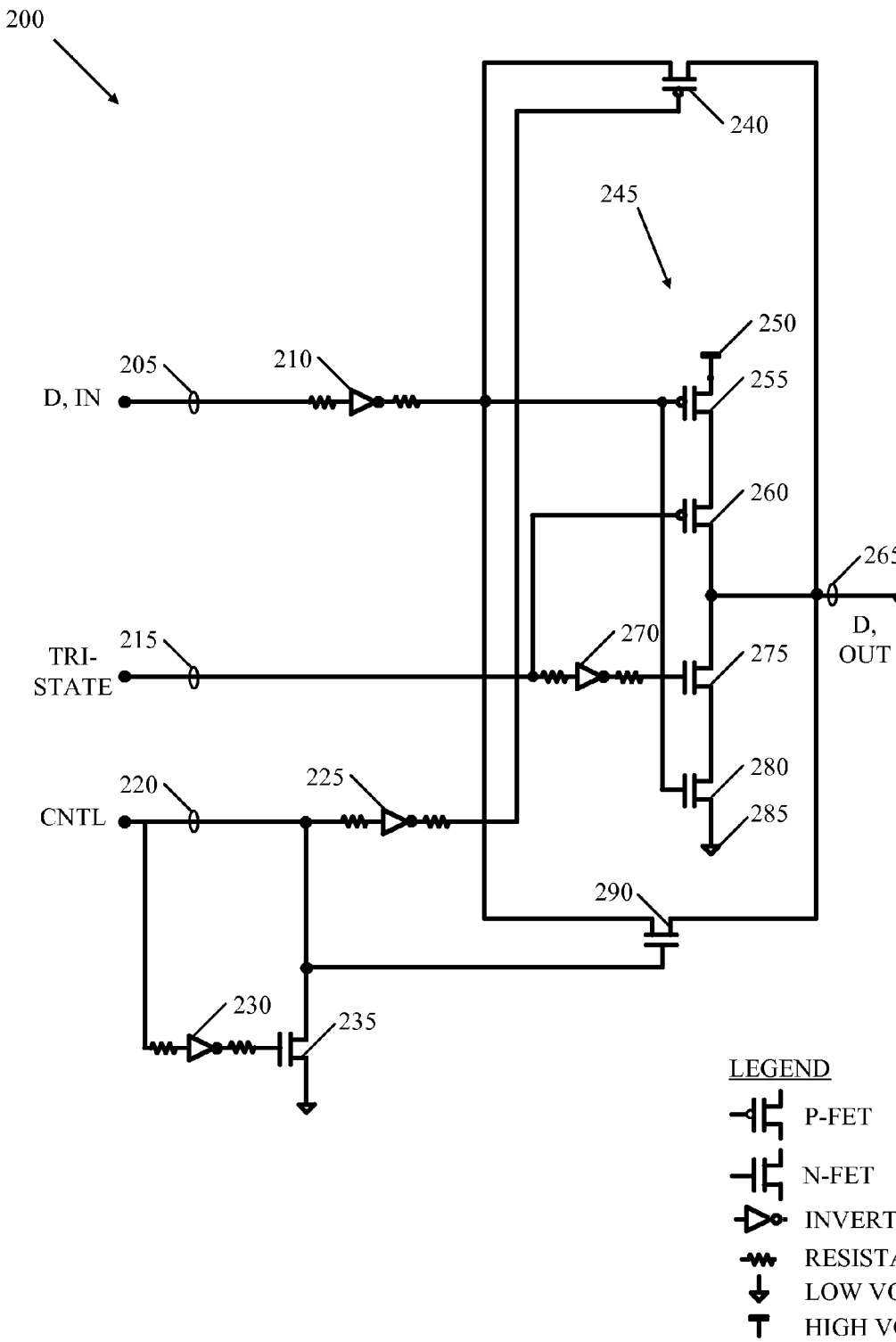
FIG. 2 depicts an embodiment of a driver circuit for generating full and reduced swing signals when active and a high impedance output when inactive.

To illustrate an example driver or buffer circuit that may be used in various embodiments we turn now to FIG. 2. FIG. 2 shows a driver circuit 200 comprising two stages of inverters that may provide three states, or modes, of logic levels: full swing, reduced swing, and tri-state. An embodiment driver similar to driver circuit 200 may have a single data input line 205 and a single data output line 265. Additionally, driver circuit 200 may employ a single tri-state control line 215 to increase the output impedance of driver circuit 200 during periods of inactivity and utilize a single swing control line 220 to switch driver circuit 200 between full swing and reduced swing modes. As depicted in FIG. 2, driver circuit 200 may not require any direct coupling to a clock signal for operation. Consequently transistors that are sometimes used for gating signals with various clock signals may therefore be unnecessary.

Driver circuit 200 may have an output stage 245 with two P-type field effect transistors (P-fets) in series, P-fet 255 and P-fet 260, and two N-type field effect transistors (N-fets) in series, N-fet 275 and N-fet 280. Driver circuit 200 may be arranged where sending swing control line 220 low will place driver circuit 200 into the full swing mode. Sending swing control line 220 low will turn off N-fet 290. Inverter 225 will invert the low of swing control line 220, generating a high to turn off P-fet 240. Inverter 230 and N-fet 235 may work in tandem with swing control line 220 and help turn off N-fet 290 when swing control line 220 goes low.

P-fet 240 and N-fet 290 may act as feedback devices in driver circuit 200. When data input line 205 is low, the output of inverter 210 pulls up causing data output line 265 to go low provided P-fet 260 and N-fet 280 are on and P-fet 240 and N-fet 290 are off. Similarly, when data input line 205 is high, data output line 265 may pull up to the full swing voltage. Stated another way, when driver circuit 200 is in full swing mode data output line 265 may drop to near ground potential Vss 285 when data input line 205 is low and rise to near supply voltage Vdd 250 when data input line goes high.

To place driver circuit 200 in reduced swing mode, swing control line 220 may be pulled up. Pulling up swing control line 220 turns on feedback N-fet 290. Additionally, when swing control line 220 goes high, the output of inverter 225 will drop low turning on feedback P-fet 240 as well. When data input line 205 goes high in this reduced swing mode, the node of data output line 265 may pull up to a reduced or lower voltage than supply voltage Vdd 250. The magnitude of the voltage to which data output line 265 pulls up may depend on the electrical characteristics of P-fet 240 and N-fet 290. Similarly, when data input line 205 goes low, the node of data output line 265 may drop down, but to a voltage level higher than ground potential Vss 285.

The resulting effect of data output line 265 pulling up to a voltage lower than Vdd 250 and dropping down to a voltage higher than Vss 285 will be a reduced voltage swing output from driver circuit 200, measurably less than the magnitude of the voltage swing produced by driver circuit 200 when in the full swing mode. When output stage 245 is arranged as shown in FIG. 2 and operated in the reduced swing mode in the manner described, output stage 245 may have a lower capacitance. Having a lower capacitance means that output stage 245 may no longer need complete charging up to the potential of Vdd 250 or complete discharging down to Vss 285. Instead, data output line 265 may swing between a high voltage of Vdd-Vt and a low voltage of Vss+Vt, where Vt represents the voltage drop created by the characteristics of P-fet 240 and N-fet 290. Having a lower operating capacitance, requiring shorter charging and discharging times, may nonetheless enable driver circuit 200 to operate relatively fast.

Figures 4A, 4B:
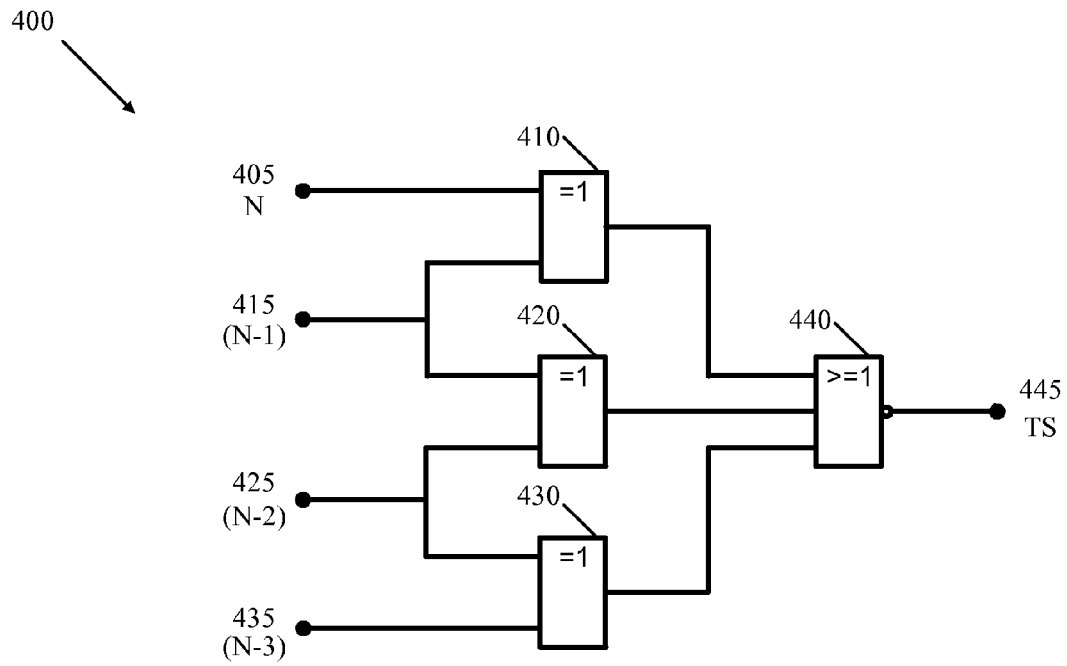
FIG. 4A depicts a tri-state circuit comprising an arrangement of logic blocks to monitor successive states of an input signal for inactivity, which can be used to increase output impedance for a driver circuit.
FIG. 4B shows a truth table for the accompanying tri-state circuit depicted in FIG. 4A.

The tri-stating or output impedance of driver circuit 200 may be controlled by manipulating tri-state control line 215. Sending tri-state control line 215 low will turn on P-fet 260, with a corresponding high signal at the output of inverter 270 turning on N-fet 275. When tri-state control line 215 is held low to operate P-fet 260 and N-fet 275 in this manner, driver circuit 200 may operate in both the full swing and reduced swing modes, propagating signals received at data input line 205 to data output line 265. However, sending tri-state control line 215 high will turn off or deactivate P-fet 260 and cause inverter 270 to generate a low output to turn off or deactivate N-fet 275. When P-fet 260 and N-fet 275 are off, the output impedance at data output line 265 may increase to a high impedance, placing the data output line 265 and driver circuit 200 in the tri-state mode. An example circuit embodiment to control tri-state control line 215 is depicted in FIG. 4A and will be discussed later.

The driver circuit embodiment depicted in FIG. 2 employs a single input and a single output. Alternative driver circuit embodiments may have varying numbers of inputs and varying numbers of outputs. For example, one embodiment may have a single input and three outputs. Three separate outputs may be necessary, for example, to drive numerous receiver circuits and meet fan-out requirements of those circuits. In an alternative embodiment, the driver circuit may have two inputs and one output. Such a circuit arrangement may be necessary when outputs from two different circuits generate alternative input signals for the driver circuit. For example, the first input may be used under a first set of operating conditions and the second input may be used under a second set of conditions. In even further embodiments, the number of inputs and outputs may vary in order to transmit multiple signals simultaneously. For example, a driver circuit may have eight or sixteen inputs and eight or sixteen outputs corresponding to eight and sixteen bit bus lines.

In addition to varying numbers of inputs and varying numbers of outputs in different embodiments, alternative embodiments may also have varying numbers of swing control lines and tri-state control lines. For example, an embodiment may have four signal input lines, four output signal lines, two swing control lines and two tri-state control lines. One swing control line may control the type of signals generated for one of the output lines while the second swing control line controls the magnitude of the signals generated by the remaining three output lines. Similarly, one tri-state control line may be used to manipulate the output impedances of two outputs while the second tri-state control line controls the output impedances of the remaining two outputs.

Additionally, the number of swing control lines and tri-state control lines may vary in different embodiments to control different levels of swing and different magnitudes of output impedance. For example, a driver circuit may have a single data input line, a single data output line, a single tri-state control line, and two swing control lines. While the driver circuit is operating, the two swing control lines may be enabled or disabled, in combination, to generate various low and high swing signals. For example, when both swing control lines are low, the driver circuit may generate full swing signals at the data output line. When the first swing control line is high the driver circuit may generate a low swing signal that varies at one low voltage range, such as between 0.08 and 0.46 volts. When the second swing control line is high the driver circuit may generate a low swing signal that varies at a second voltage range, such as between 0.52 and 0.93 volts. Using such voltage ranges may be necessary, for example, when the driver circuit sends signals to two separate receiver circuits having different input voltage requirements. As one may readily appreciate, the numbers of inputs, outputs, and control inputs may vary in different embodiments.

Driver circuit 200 may operate and generate both full swing and reduced swing signals, sending the signals to another circuit. A receiver circuit 300, shown in FIG. 3, may receive the signals generated by driver circuit 200. For example, receiver circuit 300 may be located in one area of an integrated circuit and coupled with driver circuit 200, which may reside in a second area of the integrated circuit, via an integrated circuit metalization layer interconnect or wire. More specifically, driver circuit 200 data output line 265 may transmit signals to receiver input line 305 via a circuit wire.

Receiver circuit 300 may have an input stage set of transistors, N-fet 315 and P-fet 320. The gate of N-fet 315 may be coupled with supply voltage Vdd 310 and the gate of P-fet 320 may be coupled with ground potential Vss 325. Connected to Vdd 310 and Vss 325 in this manner, N-fet 315 and P-fet 320 may create one threshold voltage drop nodes 335 and 350, respectively.

Receiver circuit 300 may also have a second stage comprised of P-fet 330 and N-fet 355. The gates of P-fet 330 and N-fet 355 may be connected to an intermediate node 360, comprising the connection of a source terminal of a P-fet 340 tied to a drain terminal of an N-fet 345. The drain of P-fet 340 may be tied to Vdd 310 and the source of N-fet 345 may be tied to Vss 325. Arranged in this fashion, P-fet 330 and N-fet 355 may operate like half latches. When receiver circuit 300 receives a low swing signal that is in the high state at receiver input line 305, first stage input transistors N-fet 315 and P-fet 325 will tend increase the voltage potentials of nodes 335 and 350 since N-fet 315 and P-fet 325 are both forward biased. As the potential of node 335 increases, P-fet 340 will become reverse biased and isolate Vdd 310 at its drain terminal from node 360 connected to its source terminal. As the potential of node 350 increases, N-fet 345 will become forward biased and couple node 360 to ground potential Vss 325. When node 360 goes low, P-fet 330 will turn on and raise node 335 to a high level, latching P-fet 340 in the off state. Additionally, dropping node 360 low turns off output stage N-fet 375 and turns on P-fet 365, causing receiver output line 370 to go high.

Similar to receiver circuit 300 receiving a low swing signal that is in the high state at receiver input line 305, receiver circuit 300 may also receive a low swing signal that is in the low state. When receiver circuit 300 receives a low swing signal at receiver input line 305 that is in the low state, first stage input transistors N-fet 315 and P-fet 325 will tend decrease the voltage potentials of nodes 335 and 350. As the potential of node 350 decreases, N-fet 345 will become reverse biased and isolate Vss 325 at its source terminal from node 360 connected to its drain terminal. As the potential of node 335 decreases, P-fet 340 will become forward biased and couple node 360 to Vdd 310. When node 360 goes high, N-fet 355 will turn on and drop node 335 to a low level, latching N-fet 345 in the off state. Additionally, raising node 360 high turns off output stage P-fet 365 and turns on N-fet 375, causing receiver output line 370 to go low.

As discussed, the signal generated at receiver output line 370 will follow the low swing signal applied to receiver input line 305. In other words, when the low swing signal applied to receiver input line 305 goes high, receiver output line 370 will also go high. Similarly, when the low swing signal applied to receiver input line 305 goes low, receiver output line 370 will also go low. Whenever a full swing signal is applied to receiver input line 305, receiver circuit 300 will behave in a similar fashion performing double inversion.

Figure 3:
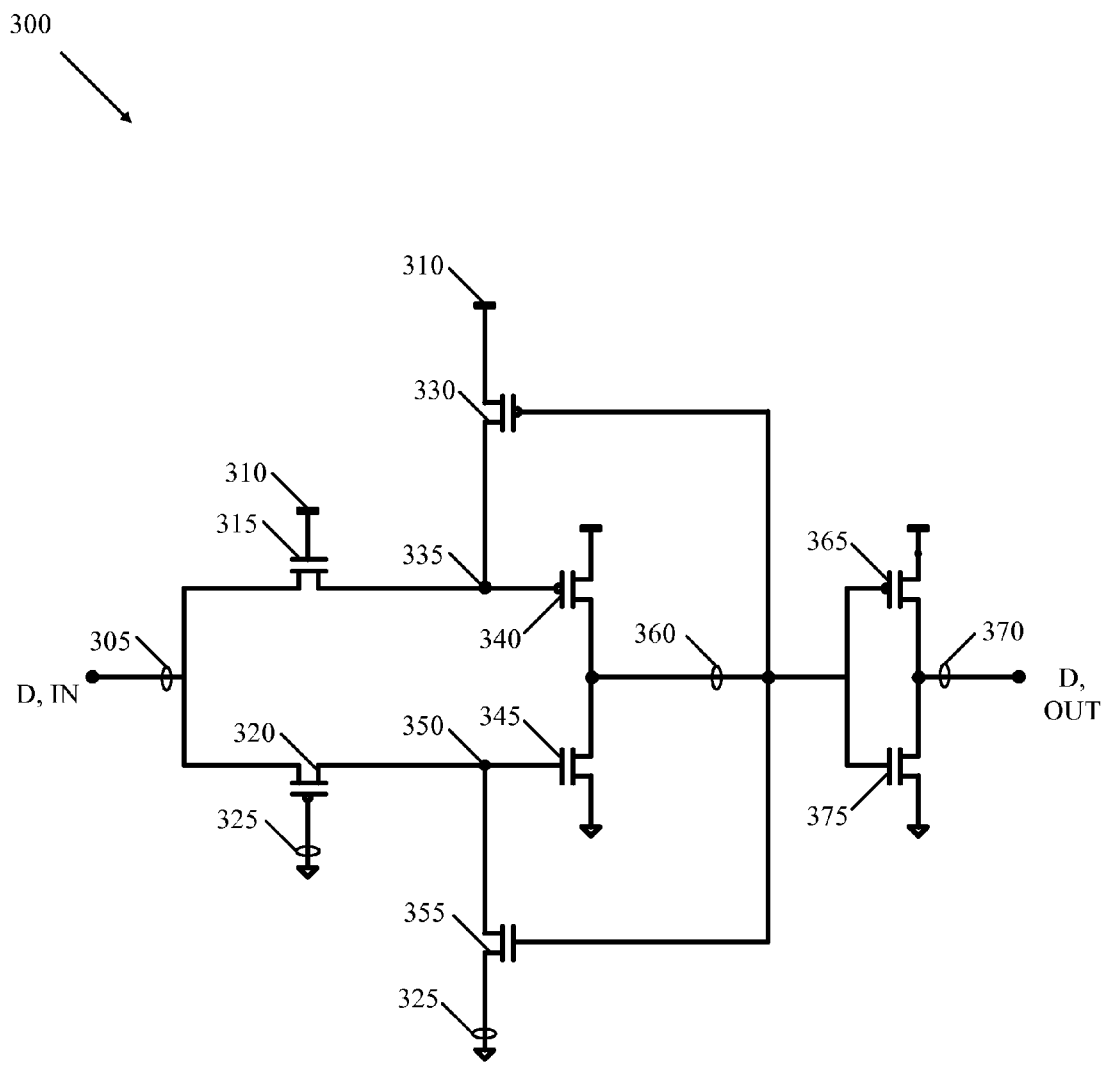
FIG. 3 shows an embodiment of a receiver circuit capable of receiving both full and reduced swing signals.

The receiver circuit embodiment depicted in FIG. 3 employs a single input and a single output. Alternative driver circuit embodiments may have varying numbers of inputs and varying numbers of outputs. Similar to the example discussed for alternative driver circuits, one alternative embodiment receiver circuit may have a single input and two outputs. Again, multiple outputs may be necessary to meet fan-out requirements. In an alternative embodiment, the receiver circuit may have two inputs and one output. Such a circuit arrangement may be necessary when outputs from two different driver circuits generate alternative input signals for the receiver circuit. In even further embodiments, the number of inputs and outputs may vary in order to transmit multiple signals simultaneously. Like the example discussed above for alternative driver circuit embodiments, a receiver circuit may also have eight or sixteen inputs and eight or sixteen outputs corresponding to eight and sixteen bit bus lines.

Additionally, the number of data input lines for the receiver circuit may vary in different embodiments to accommodate different levels of swing. For example, a driver circuit coupled with the receiver circuit may generate various low and high swing signals. The driver circuit may generate a full swing signal and two low swing signals that vary with different voltage ranges. The receiver circuit may use one data input line for receiving the full swing signal and one of the low swing signals operating with a first voltage range. The receiver may use the second data input line for receiving the second low swing signal operating with a second voltage range. Again, similar to the manner in which alternative embodiments of driver circuits may have differing numbers of inputs and outputs, the numbers of inputs and outputs for receiver circuits may vary in different embodiments as well.

Having described example embodiments for a driver circuit and a receiver circuit to receive signals generated by the driver circuit, we move now to discuss a circuit that may be used to control the output impedance of a driver circuit. FIG. 4A illustrates an arrangement of logic gates 400 that may be used to bring a driver circuit, having a single data input line, into a tri-state (TS) mode whenever the data input line remains unchanged.

As shown in FIG. 4A, the arrangement of logic gates 400 has three exclusive-OR (XOR) gates, 410, 420, and 430, and a single NOR gate 440. The arrangement of logic gates 400 also has four state lines 405, 415, 425, and 435, and one TS output line 445. Each of the four state lines may represent the state of the data input line to the driver circuit for a particular clock cycle. For example, state lines 405, 415, 425, and 435 may represent the successive states of data input line 205 for driver circuit 200, depicted in FIG. 2. In particular, state line 405 may represent the current state of data input line 205, as shown by the notation "N". Furthermore, state line 415 may represent the state that data input line 205 held during the previous clock cycle, as shown by the "N−1" notation. Similarly, state lines 425 and 435 may represent the states that data input line 205 held during the previous two and three clock cycles. Such states may be stored, for example, using low leakage latches.

Each of the XOR gates may receive two successive state lines. XOR gate 410 may receive state line 405 and state line 415, representing the current and previous states of the driver circuit data input line ("N" and "N−1"). Similarly, XOR gate 420 may receive state lines 415 and 425, representing the states of the driver circuit data input line during the two previous clock cycles. Likewise, XOR gate 430 may receive state lines 425 and 435, representing the states of the driver circuit data input line during the two and three clock cycles before the current cycle. Monitoring two consecutive states of the driver circuit data input line using an XOR gate will produce a high at the output of the XOR gate only when the state of the data input line changes state from one clock cycle to the next. In other words, the XOR gate will produce a high at its output only when the data input line changes state from a high to a low, or from a low to a high, from one clock cycle to the next.

Using three XOR gates to monitor successive state transitions of the data input line, may allow the arrangement of logic gates 400 to detect state transitions of the driver circuit data input line during the current and previous three clock cycles. Directing the outputs of XOR gates 410, 420, and 430 into NOR gate 440 will produce a high at the output of NOR gate 440, which is represented by TS output line 445 in FIG. 4A, whenever the data input line is inactive or has not changed states during four consecutive clock cycles. Once this TS signal is generated, it may be held high until the data input line changes state at least once during three successive cycles. When the data input line remains unchanged for four consecutive clock cycles, TS output line 445 may go high to disable the driver circuit and conserve power. Controlling TS output line 445 in such a manner may help avoid a power penalty of switching TS output line 445 when data input line changes frequently. This logical relationship and interaction may be more clearly understood by examining truth table 450 shown in FIG. 4B.

Truth table 450 shows possible combinations of logic transitions for a driver circuit data input line. The first four columns of truth table 450 illustrate the possible states of the data input line during four successive clock cycles. Column 470, represented by "N", may represent the current state of the data input line. Column 465, represented by "N−1", may represent the state the data input line held during the previous clock cycle. Likewise, columns 460 and 455, represented by "N−2" and "N−3", may represent the states during the second previous and third previous clock cycles, respectively. The rightmost column 475 represents solved logic for NOR gate 440, generating a low for TS output line 445 whenever any of XOR gates 410, 420, and 430 generate a high at their respective outputs. In other words, column 475 illustrates the situations where TS output line 445 will be held in a low state, indicating input signal activity to the driver circuit. Conversely, column 475 also illustrates that TS output line 445 will transition to a high state whenever there is no driver circuit input signal activity.

Note how in row 480 the data input line has remained a "0" for four consecutive clock cycles, which may indicate driver circuit inactivity. Note also that the corresponding logic output of NOR gate 440 solves to a "1" for this case. Similarly, row 490 shows how the data input line has remained a "1" for four consecutive clock cycles. This scenario may also indicate driver circuit inactivity. The corresponding logic output of NOR gate 440 solves to a "1" for this case as well. Row 485 shows a case where the data input line for the driver circuit has transitioned to a "1" after remaining in the "0" state for a number of consecutive clock cycles. Note in this case, which may represent the beginning of a period of signal activity for the driver circuit, the corresponding logic output of NOR gate 440 solves to a "0". Other rows in truth table 450 may indicate periods of signal activity, consequently solving to "0" for the output of NOR gate 440 as shown in column 475.

If TS output line 445 is coupled with a tri-state control line for the driver circuit, the arrangement of logic gates 400 may increase the output impedance of the driver circuit during a period of inactivity. For example, if TS output line 445 was coupled with tri-state control line 215 for driver circuit 200 shown in FIG. 2, it could increase the output impedance of driver circuit 200 for periods when data input line 205 experiences inactivity. Conversely, TS output line 445 could enable data output line 265 when data input line 205 experiences signal activity. As described earlier, sending tri-state control line 215 high may turn off P-fet 260 and turn off N-fet 275. When P-fet 260 and N-fet 275 were off, the output impedance at data output line 265 may increase to a high impedance, placing the data output line 265 and driver circuit 200 in a tri-state mode. As a consequence, TS output line 445 may increase the output impedance of driver circuit 200 during cases of inactivity, such as the cases illustrated by rows 480 and 490 of truth table 450, and enable data output line 265 for all other cases or periods of signal activity. Therefore, the arrangement of logic gates 400 may automatically and dynamically monitor driver circuit 200 for signal activity, enable data output line 265 during such periods of activity, and tri-state data output line 265 during periods of inactivity.

While the tri-state circuit embodiment represented in FIG. 4A has four state inputs representing four consecutive clock cycles, other embodiments may have more or fewer state inputs representing other numbers of clock cycles. For example, in one embodiment may have a tri-state circuit having ten state inputs representing the states of a data input line during ten consecutive clock cycles. Also, while the tri-state circuit embodiment represented in FIG. 4A is implemented using XOR and NOR logic gates, alternative embodiments may employ other types of logic gates. As examples, one embodiment may implement the tri-state circuit using NAND gates while another embodiment may implement the tri-state circuit using AND, OR, and NOT gates. Additionally, while the tri-state circuit embodiment represented in FIG. 4A has one output, other embodiments may have multiple outputs. Multiple outputs may be used, for example, to tri-state numerous driver circuits that operate simultaneously.

Some embodiments may implement tri-state control circuits that do not monitor the data input line of the driver circuit using logic blocks. Such embodiments may either not monitor the data input line for activity in order to tri-state the driver circuit or they may monitor the data input line for activity using different circuit elements, other than logic blocks. For example, one embodiment may either enable or tri-state the driver circuit using a control signal originating within the circuit sending the data signals to the driver circuit. In such an embodiment, the control signal may go low in anticipation of sending the signals to the driver circuit and go high upon completion of sending them.

An example of an embodiment with a tri-state control circuit that may monitor the data input line for activity using circuit elements other than logic blocks may be a network of resistance and capacitance (RC network) used to trigger the tri-state control line. For instance, the RC network may charge relatively quickly and enable the driver output line when the driver circuit receives signals. Conversely, during periods of inactivity, the RC network may discharge to a threshold point whereupon the network may tri-state the driver output line.

Figure 5A:
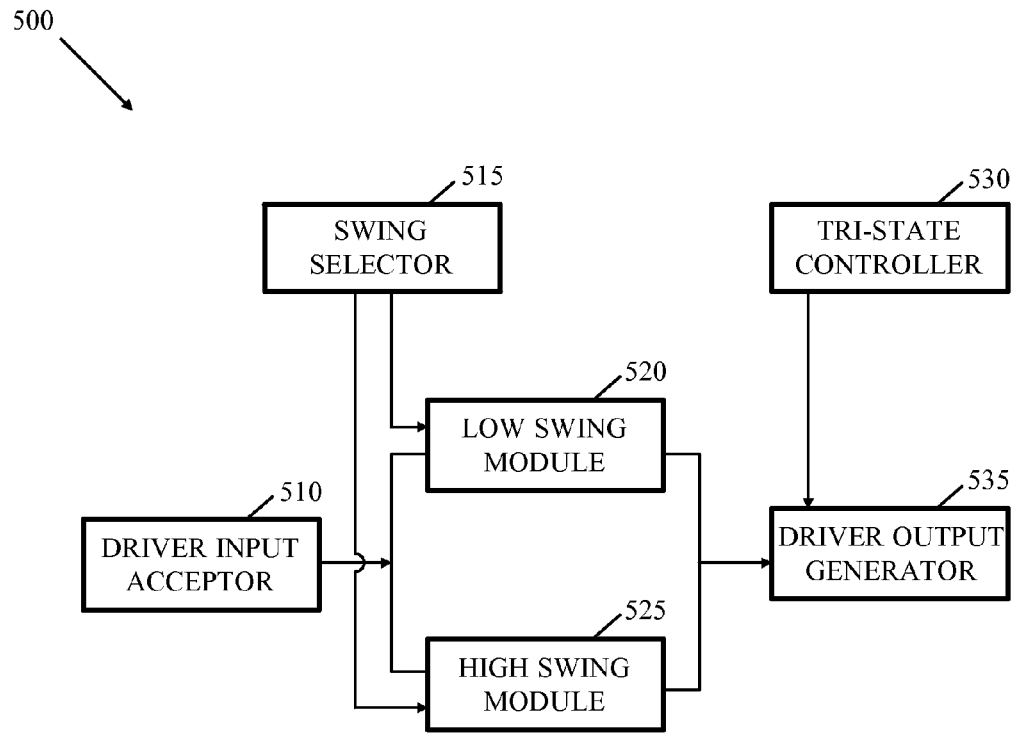
FIGS. 5A-5B show block diagrams for driver modules and receiver modules with both high and low swing signaling capabilities.
Figure 5B:
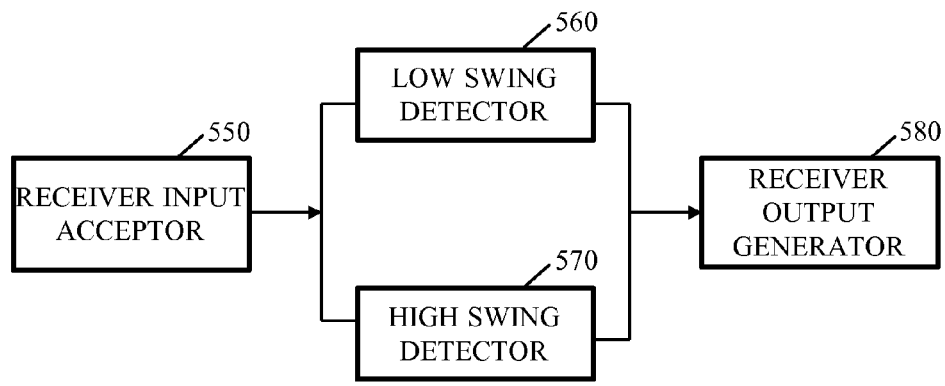

While FIGS. 2 and 3 illustrate specific embodiments of a driver circuit and a receiver circuit, FIGS. 5A and 5B illustrate what may comprise more general arrangements for driver and receiver circuit embodiments. FIG. 5A shows a driver circuit arrangement 500. The driver circuit arrangement 500 may have a driver input acceptor 510 to receive one or more signals and couple them to a low swing module 520 and a high swing module 525. In some embodiments driver input acceptor 510 may comprise a relatively simple element, such as a terminal or node comprising a conductive means, such as a wire or interconnect, coupling an input signal received by driver input acceptor 510 to both low swing module 520 and high swing module 525. In alternative embodiments driver input acceptor 510 may comprise a more complex arrangement of circuit elements, with such elements as transistors, capacitors, and resistors. For example, driver input acceptor 510 may comprise one or more transistors arranged to accept one or more input signals and direct the input signals to low swing module 520 and the high swing module 525 based upon a control signal. In other words, driver input acceptor 510 may comprise one or more multiplexers to select one or more signals and direct one or more of them to low swing module 520 and high swing module 525.

The driver circuit arrangement 500 may have a swing selector 515 coupled with both low swing module 520 and high swing module 525. Swing selector 515 may enable high swing module 525 and disable low swing module 520 when speed or high performance is critical, transmitting a full swing signal to a driver output generator 535 corresponding to a signal accepted by driver input acceptor 510. Alternatively, swing selector 515 may disable high swing module 525 and enable low swing module 520 when speed is not critical or preferred over power conservation, transmitting a low swing signal from low swing module 520 to driver output generator 535.

Swing selector 515 may comprise a simple interconnect, sending the same signal to both low swing module 520 and high swing module 525. As a consequence, the circuitry for determining whether a high swing signal or a low swing signal is sent to driver output generator 535 may be incorporated into low swing module 520 and high swing module 525. For example, when swing selector 515 sends a common high signal to both low swing module 520 and high swing module 525, the high signal may both enable high swing module 525 and disable low swing module 520. Correspondingly, a low signal from swing selector 515 may enable low swing module 520 and simultaneously disable high swing module 525. In the alternative, high swing module 525 may be enabled with a low signal from swing selector 515 while low swing module 520 is disabled, and vice versa.

Swing selector 515 may also comprise a network of circuit elements that sends a high signal to either low swing module 520 or high swing module 525 to enable or disable it, and send a complementary low signal to the other module to disable or enable it, effectively enabling one module while disabling the other. For example, swing selector 515 may enable low swing module 520 using a high level signal while sending a low level signal to high swing module 525 to disable it. The network of circuit elements comprising swing selector 515 may accept a single or multiple inputs from external circuits, perform multiple signal processing operations on the signals, and pass the processed signals to low sing module 520 and high swing module 525. For example, in one embodiment swing selector 515 may accept a single swing control signal and send a corresponding inverted signal to low swing module 520 while passing the unmodified swing control signal directly to high swing module 525.

In an alternative embodiment, swing selector 515 may accept three swing control signals from external circuits. One of the control signals may comprise a digital signal having a 0 to 5 volt logic differential. A second signal may also comprise a digital signal having a 0 to 3 volt logic differential. The third signal may comprise a pulsed or alternating signal. In this embodiment swing selector 515 may accept the three signals, perform one or more processing operations on the signals, such as adjusting the voltage logic levels and determining which swing module to enable based upon the states of the input signals, and transmit enabling and disabling signals to the low swing module 520 and high swing module 525.

Low swing module 520 and high swing module 525 may generate low swing and high swing signals, respectively, and send the generated signals to driver output generator 535. Low swing module 520 and high swing module 525 may be enabled with high level logic signals in some embodiments and enabled with low level logic signals in other embodiments. Additionally, one module may be enabled with a high level signal while the other module is enabled with a low level signal, and vice versa. In some embodiments, low swing module 520 and high swing module 525 may exist as separate circuits located adjacent to each other or in separate areas of an integrated circuit. In alternative embodiments, low swing module 520 and high swing module 525 may comprise a single circuit or single arrangement of circuit elements, generating a low or high swing signal in response to one or more signals transmitted from swing selector 515. For example, a single input from swing selector 515 may go high to activate some elements in the single circuit and generate a high swing signal and go low to activate other elements and generate a low swing signal.

In different embodiments, the voltage ranges of signals transmitted by low swing module 520 and high swing module 525 may vary. For example, in one embodiment high swing module 525 may generate digital signals having a voltage swing of 0 to 3.3 volts and low swing module 520 may generate digital signals having a voltage swing of 2.5 volts to 3.2 volts. In an alternative embodiment high swing module 525 may generate signals having a voltage swing of 0.3 to 0.98 volts while low swing module 520 may generate signals having a voltage swing of 0.1 to 0.4 volts.

Similar to the manner in which low swing module 520 and high swing module 525 may exist as combined or separate circuits, driver output generator 535 may exist as one or more modules coupled with low swing module 520 and high swing module 525. For example, in one embodiment driver output module 535 may exist as a single circuit arrangement located a short distance from low swing module 520 and high swing module 525. In an alternative embodiment, driver output generator 535 may be divided into two separate circuit networks integrally coupled with low swing module 520 and high swing module 525. In even further embodiments, driver output generator may comprise a single node or interconnect coupled with output circuit elements of both low swing module 520 and high swing module 525, such that a signal generated by either low swing module 520 or high swing module 525 is coupled with whatever external circuit receives the signals generated by driver circuit arrangement 500.

Driver circuit arrangement 500 may also have an output controller 530. Output controller 530 may comprise a circuit of logic blocks that monitors driver input acceptor 510 for activity and increases output impedance of, or tri-states, driver output generator 535 during periods of inactivity. Alternative embodiments may couple output controller 530 to the circuit elements that generate the low and high swing signals. For example, output controller 530 may send one signal to tri-state low swing module 520 when low swing module 520 is inactive and send another signal to tri-state high swing module 525 when high swing module 525 is inactive.

FIG. 5B shows a receiver circuit arrangement 540. The receiver circuit arrangement 540 may have a receiver input acceptor 550 to accept or receive signals transmitted from one or more driver circuits, such as driver circuit arrangement 500 in FIG. 5A. In some embodiments, receiver input acceptor 550 may comprise interconnect wires coupled with a low swing detector 560 and a high swing detector 570, such that signals received by receiver input acceptor 550 are passed to both detector modules unaltered. In alternative embodiments, receiver input acceptor 550 may comprise an arrangement of circuit elements that perform some type of signal conditioning, such as inversion or voltage shifting, and pass the conditioned signals to low swing detector 560 and high swing detector 570.

Additionally, in alternative embodiments, receiver input acceptor 550 may have a control input that indicates where receiver input acceptor 550 should direct signals received by receiver input acceptor 550. For example, receiver input acceptor 550 may comprise a two-input multiplexer circuit. A circuit that generates low swing signals may send signals to one of the multiplexer inputs while another circuit that generates high swing signals may send signals to the second multiplexer input. A selection signal may be sent to the control input of the multiplexer, controlling which signal the multiplexer passes to low swing detector 560 and high swing detector 570. For example, the selection signal may go high forcing the multiplexer to send signals received at the high swing input to high swing detector 570, or the selection signal may go low wherein the multiplexer may send signals received at the low swing input to low swing detector 560.

As described, low swing detector 560 and high swing detector 570 may receive the one or more signals from receiver input acceptor 550. Upon receiving such signals, low swing detector 560 and high swing detector 570 may work separately or in conjunction with each other to determine whether the received signals have a low voltage swing or a high voltage swing. Depending on the level of voltage swing of the received signals, low swing detector 560 and high swing detector 570 may work in conjunction with receiver output generator 580 to generate signals having characteristics acceptable for use with external circuits coupled with receiver output generator 580. For example, receiver input acceptor 550 may receive signals having a low voltage swing. Low swing detector 560 may respond by communicating the low swing signals to receiver output generator 580, while high swing detector 570 ignores such signals. In the alternative, receiver input acceptor 550 may receive signals having a high voltage swing. High swing detector 570 may respond by communicating the high swing signals to receiver output generator 580, while low swing detector 560 ignores the signals.

As just discussed, receiver output generator 580 may generate signals corresponding to signals received from low swing detector 560 and high swing detector 570. Depending on the embodiment, the signals that receiver output generator 580 generates and transfers to external circuits may or may not match the characteristics of the signals received by receiver input acceptor 550. For example, receiver output generator 580 may generate 0 to 1 volt swing signals in response to signals received by receiver input acceptor 550 having a low swing ranging from 0 to 0.3 volts. Also, receiver output generator 580 may produce inverted or negated signals in response to signals received by receiver input acceptor 550. In other words, receiver output generator 580 may go low in response to the signal received at receiver input acceptor 550 going high.

While the embodiment of the receiver circuit arrangement 540 shown in FIG. 5B has four separate functional blocks, the number of such blocks is not critical and may easily vary from embodiment to embodiment. For example, while the receiver circuit arrangement 540 has low swing detector 560 separated from high swing detector 570, alternative embodiments may have low swing detector 560 and high swing detector combined in a single functional block or circuit arrangement. In other words, the circuit elements may be so arranged that clearly demarcating such functional blocks may be difficult or impossible. In such a case, a single block detecting both the low and high signals may be more appropriate or accurate. Alternatively, some embodiments may include more functional blocks. For example, an embodiment may include a receiver tri-state controller which disables low swing detector 560 when it is inactive and disables high swing detector 570 when it is inactive.

Figure 6:
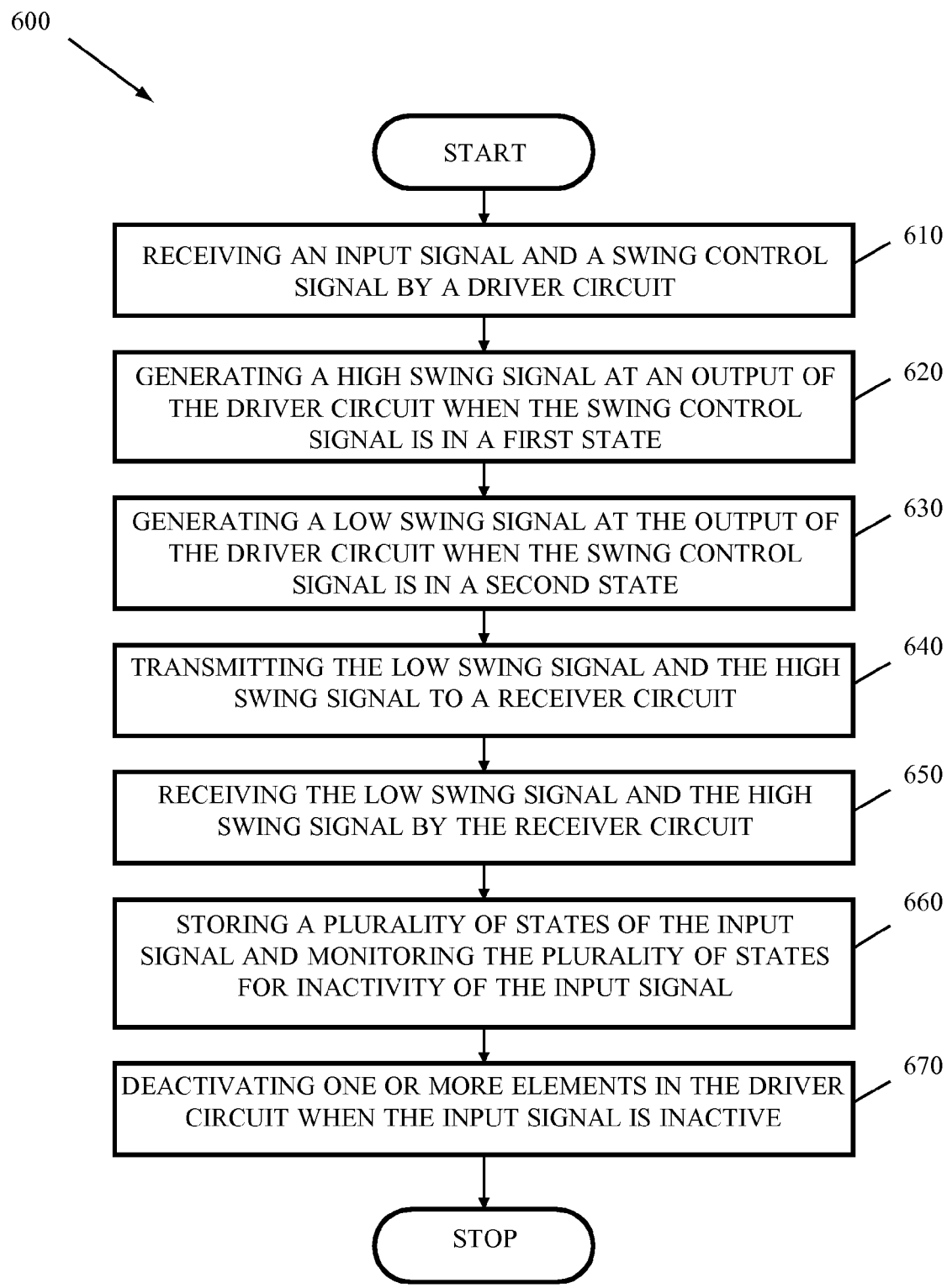
FIG. 6 depicts a flowchart of a method to decrease power consumption of interconnecting devices in integrated circuits.

FIG. 6 depicts a flowchart 600 illustrating an embodiment of a method to decrease power consumption of interconnecting devices in integrated circuits. Flowchart 600 begins with receiving an input signal and a swing control signal by a driver circuit (element 610). The input signal may originate in one area or in one circuit section of an integrated circuit and need to be transmitted to another circuit section. The swing control signal may also be transferred to the driver circuit and dictate whether the driver circuit generates high swing or low swing signals in response to the input signal. For example, the swing control signal may cause the driver circuit to either generate low swing signals or high swing signals depending on whether power conservation or rapid signal transmission is desired more.

After receiving the input and swing control signals, the method may continue by generating a high swing signal at an output of the driver circuit when the swing control signal is in a first state (element 620). Continuing with the example above, operating conditions of the integrated circuit may require the driver circuit to transmit the signals to the other circuit section as rapidly as possible to maximize system performance. Accordingly, the swing control signal may transition from low to high and cause the driver circuit transmit or generate high swing signals at an output of the driver circuit.

The method may also include generating a low swing signal at the output of the driver circuit when the swing control signal is in a second state (element 630). Again continuing with the preceding example, operating conditions of the integrated circuit may require the driver circuit to maximize power consumption when system performance is not an issue. Accordingly, the swing control signal may transition from high to low and cause the driver circuit transmit or generate low swing signals, which may tend to conserve power.

Upon generating the high and low swing signals, a method according to flowchart 600 may continue by transmitting the low swing and high swing signals to a receiver circuit in another section of the integrated circuit (element 640), whereupon the receiver circuit receives such transmitted signals (element 650). For example, the driver circuit may transmit the generated signals to the receiver circuit using a 100 um interconnect wire. Once the high and low swing signals are received by the receiver circuit, the receiver circuit may decode or interpret the signals and transmit the decoded signals to other circuits in the integrated circuit.

When the driver circuit experiences a lull or decrease in input signal activity, a method according to flowchart 600 may deactivate one or more elements in the driver circuit (element 670). For example, the method may involve deactivating isolating circuit elements, such as transistors or capacitors, by reverse biasing one or more transistors coupled with the circuit elements. As a more specific example, the method may involve deactivating or isolating two decoupling capacitors in a bank of four decoupling capacitor elements to reduce unnecessary operating currents and associated power in the two deactivated capacitors.

To determine when one or more elements in the driver circuit should be deactivated, the method may involve storing a number of input signal states over a period of time and monitoring the states for inactivity (element 660). For example, five successive states of the input signal may be latched and stored concurrent with five successive clock cycles. If the input signal remains high or remains low for all five successive clock periods, the deactivating circuit elements may be triggered from logic elements coupled with the latched input state signals.

One skilled in the art of integrated circuit design will readily appreciate the flexibility and benefits that the aforementioned example methods and apparatuses for decreasing power consumption of interconnecting devices afford the field of integrated circuit fabrication. The specifically describe examples are only a few of the potential arrangements wherein the use of drivers, receivers, and tri-state control circuits greatly enhance power conservation in integrated circuits, without necessarily sacrificing speed when throughput is critical.

It will be apparent to those skilled in the art having the benefit of this disclosure that the present invention contemplates methods and apparatuses that may decrease power consumption of interconnecting devices in integrated circuits. It is understood that the form of the invention shown and described in the detailed description and the drawings are to be taken merely as examples. It is intended that the following claims be interpreted broadly to embrace all the variations of the example embodiments disclosed.

Although the present invention and some of its advantages have been described in detail for some embodiments, it should be understood that various changes, substitutions and alterations can be made herein without departing from the spirit and scope of the invention as defined by the appended claims. Further, embodiments may achieve multiple objectives but not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system, comprising:
    a bus; and
    an integrated circuit coupled with the bus, wherein the integrated circuit comprises:
        a driver circuit, wherein the driver circuit is arranged to receive an input signal and generate a full swing signal and a reduced swing signal at an output node of the driver circuit in response to the input signal; wherein further the driver circuit is arranged to generate the full and reduced swing signals in response to a swing control signal, wherein further the output node is coupled to an input node of the driver circuit via a field effect transistor (FET), the FET to reduce a voltage magnitude of the input signal via feedback from the output node when generating the reduced swing signal; and
        a tri-state control circuit to monitor activity of the driver circuit and increase impedance at the output node after the driver circuit remains inactive for a period of time.

2. The system of claim 1, further comprising a receiver circuit coupled with the output node via a circuit interconnect.

3. The system of claim 1, wherein the driver circuit comprises two stages of inverters arranged to generate the full and reduced swing signals.

4. The system of claim 1, wherein the tri-state control circuit is adapted to store states of the input signal for four consecutive clock cycles, wherein further the logic to determine the activity of the driver circuit comprises three exclusive-OR (XOR) gates and a NOR gate.

5. The system of claim 1, wherein the integrated circuit comprises a processor in a computer.

6. A method of reducing power consumption in an integrated circuit, the method comprising:
    generating a high swing signal at an output of a driver module in response to a first state of a control line;
    generating a low swing signal at the output of the driver module in response to a second state of the control line, wherein the high swing signal and the low swing signal are generated in response to an input signal, wherein further the generating the low swing signal comprises coupling the output to an input via a field effect transistor (FET) to reduce the voltage magnitude of the input signal via feedback from the output;
    monitoring the input signal to determine activity of the input signal; and
    increasing, in response to the monitoring, the output impedance of the driver module after the input signal remains inactive for a period of time.

7. The method of claim 6, wherein the monitoring comprises storing multiple states of the input signal to detect when the input signal remains inactive for the period of time.

8. The method of claim 7, further comprising receiving the high swing signal and the low swing signal by a receiving circuit, wherein a second stage of the receiving circuit provides a half-latch function.

9. The method of claim 7, further comprising: comparing the multiple states for the detection of the inactivity, wherein the storing the multiple states comprises storing states of the input signal corresponding to a predetermined number of successive clock cycles.

10. The method of claim 9, wherein the increasing the output impedance comprises turning off a pair of CMOS transistors directly connected to the output.

11. An apparatus to reduce power consumption in an integrated circuit, the apparatus comprising:
    a swing selector to select between a full swing mode and a low swing mode;
    a swing module coupled with the swing selector, the swing module to generate a full swing signal at an output in response to a first state of the swing selector and generate a low swing signal in response to a second state of the swing selector, wherein the swing selector comprises a first N-type field effect transistor (N-fet) and a first P-fet, wherein further the terminals of both the first N-fet and the first P-fet couple the output to an input of the swing module to reduce a voltage potential of the output upon activation; and
    an output controller to monitor activity of the swing module and increase output impedance of the output after an input signal to the swing module remains inactive for a quantity of time.

12. The apparatus of claim 11, further comprising a receiver circuit coupled with the swing module via an interconnect, the receiver circuit to receive the full swing and low swing signals for use in a separate circuit coupled with the receiver circuit.

13. The apparatus of claim 12, wherein the interconnect is a global line of the integrated circuit, wherein further the receiver circuit is adapted to respond like a half latch upon receipt of the low swing signal.

14. The apparatus of claim 12, wherein the receiver circuit is adapted to receive the full swing signal and invert the full swing signal twice.

15. The apparatus of claim 11, wherein the output controller comprises latches to store successive states of the input signal at different times and logic circuit elements to compare the current state of the input signal with the stored states to determine when the input signal remains inactive for the quantity of time.

16. The apparatus of claim 15, wherein feedback from the output affects a voltage magnitude of at least one of the low swing signal and the full swing signal.

17. The apparatus of claim 11, wherein the swing module and the output controller comprise a second P-fet and a third P-fet and a second N-fet and a third N-fet, wherein terminals of the second and third P-fets are connected in series between a positive voltage supply (Vdd) and the output, wherein further terminals of the second and third N-fets are connected in series between the output and a negative voltage supply (Vss).

18. The apparatus of claim 17, wherein the swing module and the output controller consist essentially of the second and a third P-fets and the second and a third N-fets.

19. The apparatus of claim 18, wherein the nominal supply voltage of Vdd is configured to equal one volt and the nominal supply ground is configure to equal zero volts, wherein further the swing module is configured to generate a voltage level of approximately 0.79 volts for a logical true state and generate a voltage level of approximately 0.20 volts for a logical false state when generating the reduced swing signals.

* * * * *